(12) United States Patent
Arai et al.

(10) Patent No.: US 8,959,758 B2
(45) Date of Patent: Feb. 24, 2015

(54) METHOD OF MANUFACTURING CIRCUIT BOARD, METHOD OF MANUFACTURING ELECTRONIC DEVICE, AND ELECTRONIC DEVICE

(75) Inventors: Kazuya Arai, Kawasaki (JP); Shinpei Ikegami, Kawasaki (JP); Hitoshi Suzuki, Kawasaki (JP); Kei Fukui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 255 days.

(21) Appl. No.: 13/426,874

(22) Filed: Mar. 22, 2012

(65) Prior Publication Data

US 2012/0241206 A1    Sep. 27, 2012

(30) Foreign Application Priority Data

Mar. 26, 2011   (JP) .................. 2011-069039

(51) Int. Cl.
*H05K 3/00* (2006.01)
*H01L 21/48* (2006.01)
*H05K 3/46* (2006.01)
*H01L 23/498* (2006.01)
*H01L 23/00* (2006.01)
*H05K 1/11* (2006.01)

(52) U.S. Cl.
CPC .......... *H01L 21/4857* (2013.01); *H05K 3/4682* (2013.01); *H01L 23/49822* (2013.01); *H01L 24/16* (2013.01); *H01L 24/32* (2013.01); *H01L 24/73* (2013.01); *H05K 1/113* (2013.01); *H05K 3/0097* (2013.01); *H01L 2224/16225* (2013.01); *H01L 2224/16235* (2013.01); *H01L 2224/73204* (2013.01); *H01L 2924/01019* (2013.01); *H01L 2924/01087* (2013.01); *H01L 2924/15311* (2013.01); *H05K 2203/0156* (2013.01); *H05K 2203/1536* (2013.01); *H01L 2224/32225* (2013.01)
USPC ............................................. 29/832

(58) Field of Classification Search
USPC .................................... 29/832, 846
See application file for complete search history.

(56) References Cited

U.S. PATENT DOCUMENTS

| 6,418,615 B1 | 7/2002 | Rokugawa et al. |
| 2005/0098347 A1 | 5/2005 | Hwang et al. |
| 2007/0082501 A1 | 4/2007 | Hurwitz et al. |

(Continued)

FOREIGN PATENT DOCUMENTS

| JP | 2000-323613 A | 11/2000 |
| JP | 2008-251702 A | 10/2008 |

(Continued)

OTHER PUBLICATIONS

Korean Office Action application No. 10-2012-30483 dated Apr. 29, 2013.

(Continued)

*Primary Examiner* — Jeremy C Norris
(74) *Attorney, Agent, or Firm* — Squire Patton Boggs (US) LLP

(57) ABSTRACT

A method of manufacturing a circuit board includes forming a first electrode on a support substrate, covering the support substrate and the first electrode with a first insulating layer, polishing the first insulating layer to expose a first surface of the first electrode, forming a first wiring on the first insulating layer after exposing the first surface of the first electrode, the first wiring being connected to the first electrode, and removing the support substrate to expose a second surface of the first electrode after forming the first wiring.

9 Claims, 26 Drawing Sheets

(56) References Cited

U.S. PATENT DOCUMENTS

| | | |
|---|---|---|
| 2007/0124925 A1 | 6/2007 | Nakamura |
| 2008/0308308 A1 | 12/2008 | Kobayashi |
| 2009/0101401 A1 | 4/2009 | Kobayashi et al. |
| 2011/0147061 A1* | 6/2011 | Leung et al. ................ 174/260 |

FOREIGN PATENT DOCUMENTS

| | | |
|---|---|---|
| JP | 2009-188022 A | 8/2009 |
| KR | 10-2005-0043549 A | 5/2005 |
| KR | 10-2007-0059945 A | 6/2007 |
| KR | 10-2009-0037811 A | 4/2009 |

OTHER PUBLICATIONS

Office Action dated Aug. 15, 2014, issued in corresponding CN Patent Application No. 201210081011.8 (with English translation).

Office Action dated Oct. 14, 2014, issued in corresponding JP Application No. 2011-069039 (partial English translation attached).

* cited by examiner

METHOD OF MANUFACTURING CIRCUIT BOARD, METHOD OF MANUFACTURING ELECTRONIC DEVICE, AND ELECTRONIC DEVICE

CROSS-REFERENCE TO RELATED APPLICATION

This application is based upon and claims the benefit of priority of the prior Japanese Patent Application No. 2011-069039, filed on Mar. 26, 2011, the entire contents of which are incorporated herein by reference.

FIELD

The embodiments discussed herein are related to a method of manufacturing a circuit board on which an electronic device is to be mounted, a method of manufacturing an electronic device, and an electronic device.

BACKGROUND

A so-called single-sided multilayer substrate, which does not include a core substrate, may be used as a circuit substrate on which to mount an electronic device such as a semiconductor device. The single-sided multilayer substrate is manufactured by alternately laminating conductive layers and insulated layers on each of two sides of a support substrate and finally removing the support substrate. A process at the initial stage of manufacturing a single-sided multilayer substrate will be simply described below.

In the manufacturing of a single-sided multilayer substrate, electrode pads that are connected to the terminals of an electronic device such as a semiconductor device are first formed on each of two sides of a support substrate. Next, insulating sheets are attached onto the two sides of the support substrate to cover the electrode pads with the insulating sheets. Via holes extending to the electrode pads are then formed on each insulating film by, for example, laser machining or etching. To control the depth of the via hole, the electrode pad is used as a film to stop machining. A metal film is deposited on the surface of the insulating film and the interiors of the via hole, forming a wiring pattern and a via simultaneously. A single-sided multilayer substrate is manufactured by repeating these processes. Japanese Laid-open Patent Publication No. 2000-323613 is an example of related art.

Narrow pitches among electrode pads on circuit boards have been demanded recently to match narrow pitches among the terminals of electronic parts. Since the electrode pad is used as a film to stop machining in via hole depth control, that is, as a surface to stop laser machining or etching, however, it is not possible to make the electrode pad smaller than a demanded via diameter. In addition, laser machining or etching involves little machining error (machining position displacement), so it is desirable that the electrode pad be made larger than the demanded via diameter by an amount equal to the machining error. That is, electrode pads on circuit boards used at present are not preferably reduced to or below a size equal to the via diameter. Accordingly, it has been difficult to narrow a pitch between electrode pads by reducing the size of the electrode pad on a circuit substrate.

SUMMARY

According to an aspect of the invention, a method of manufacturing a circuit substrate includes forming a first electrode on a support substrate, covering the support substrate and the first electrode with a first insulating layer, polishing the first insulating layer to expose a first surface of the first electrode, forming a first wiring on the first insulating layer after exposing the first surface of the first electrode, the first wiring being connected to the first electrode, and removing the support substrate to expose a second surface of the first electrode after forming the first wiring.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

First, a first embodiment will be described with reference to FIGS. 1 to 27.

Structure of a Circuit Substrate 10

Figure 1:
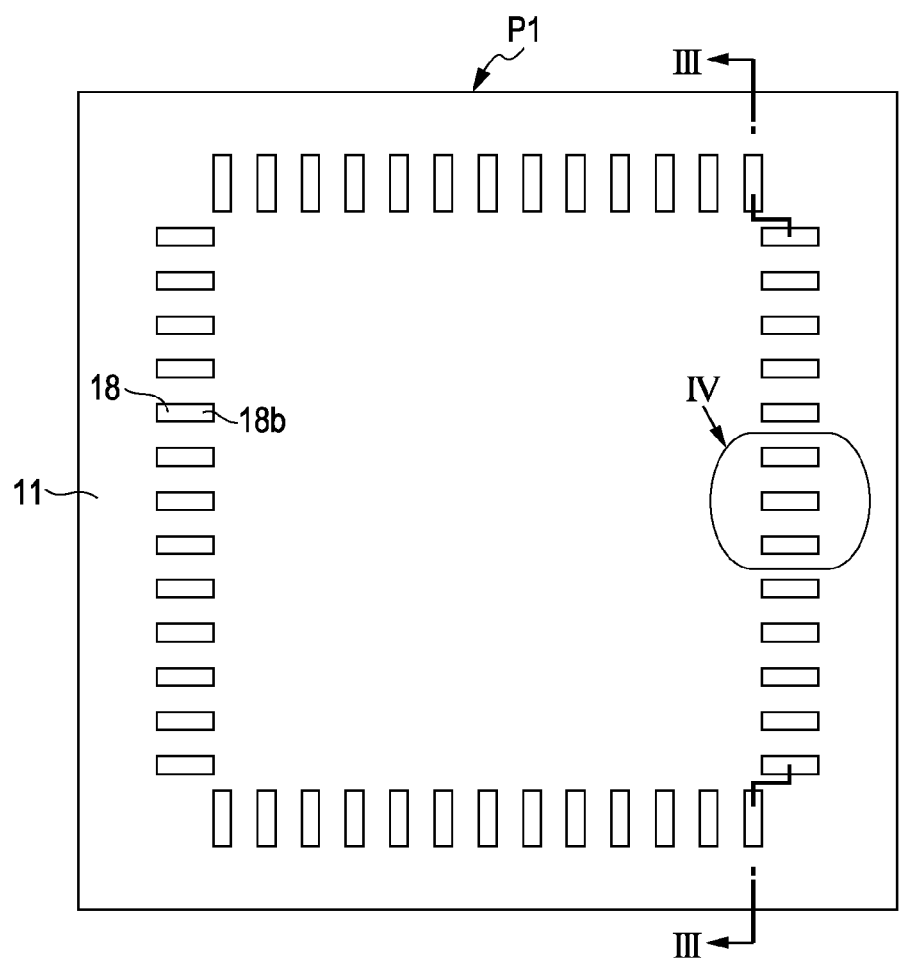
FIG. 1 is a rear view of a circuit substrate according to a first embodiment.
Figure 2:
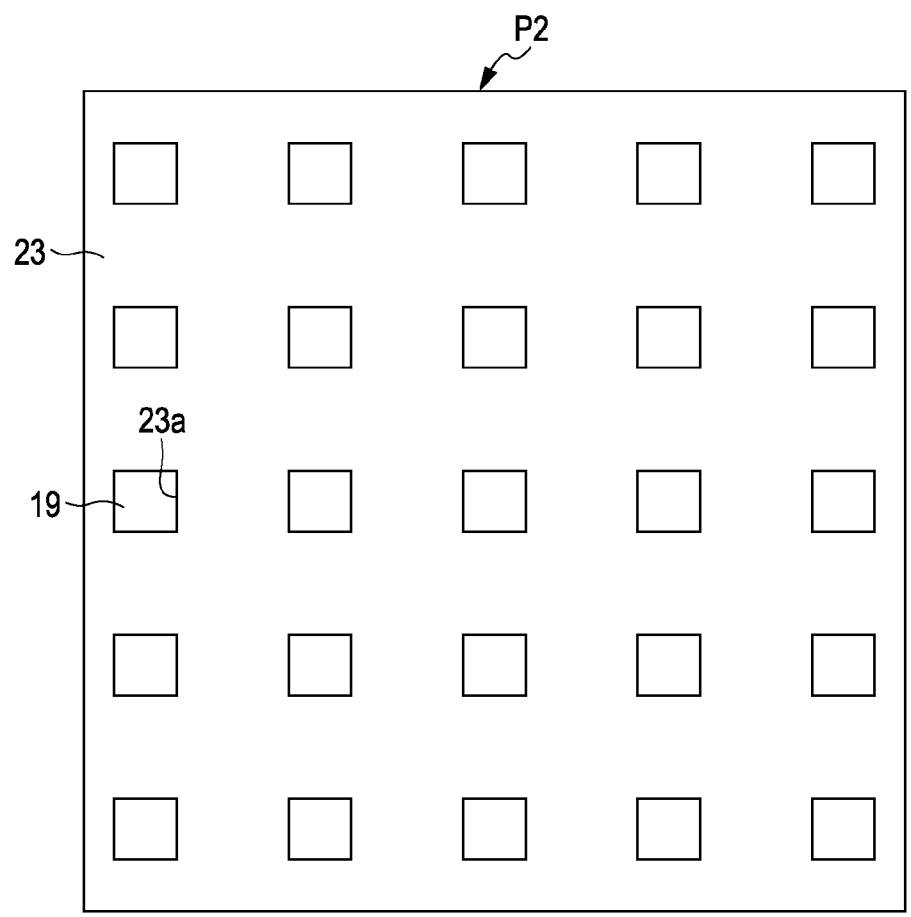
FIG. 2 is a front view of the circuit substrate according to the first embodiment.
Figure 3:
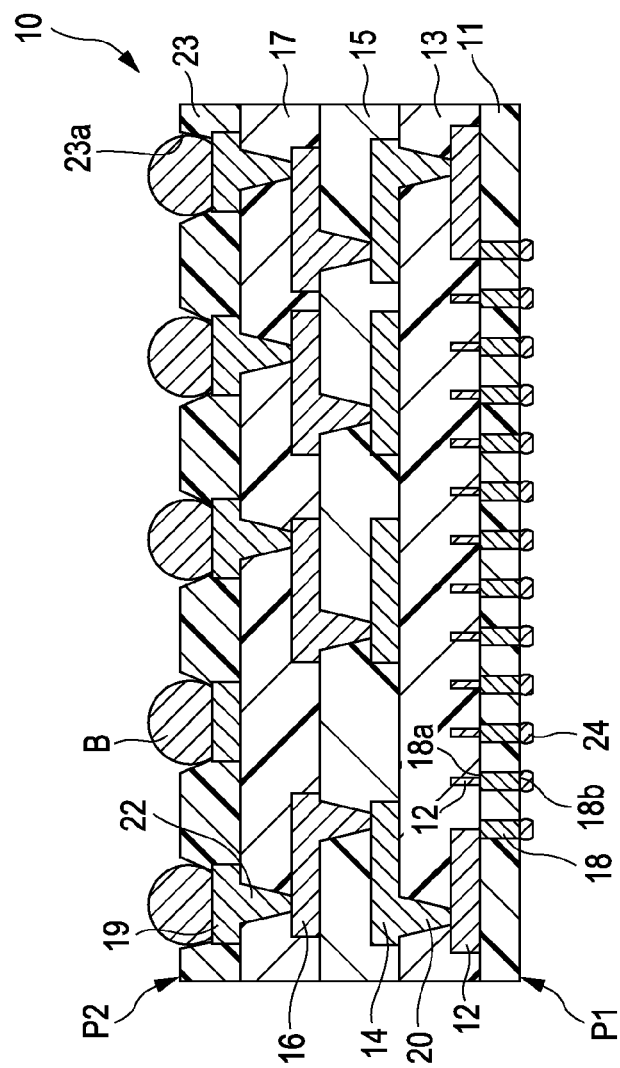
FIG. 3 is a cross sectional view of the circuit substrate according to the first embodiment.
Figure 4:
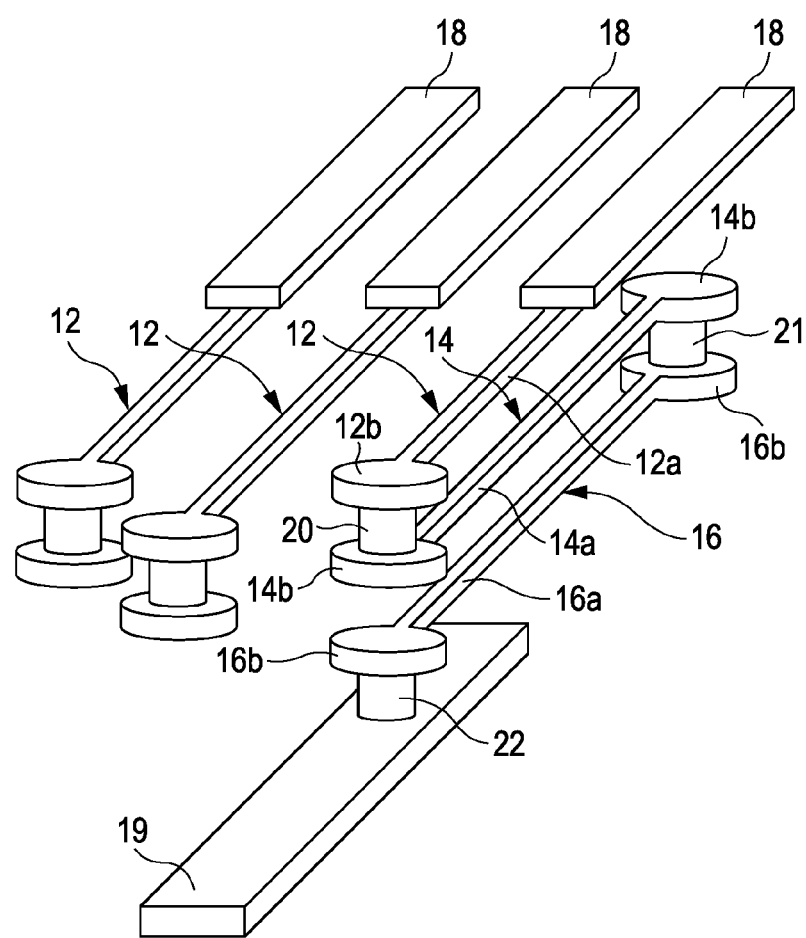
FIG. 4 is a perspective view of first electrode pads, first wiring patterns, first vias, and second wiring patterns according to the first embodiment.

FIG. 1 is a rear view of the circuit substrate 10 according to the first embodiment. FIG. 2 is a front view of the circuit substrate 10 according to the first embodiment. FIG. 3 is a cross sectional view taken along the line III-III in FIG. 1, illustrating a section of the circuit substrate 10 according to the first embodiment. FIG. 4 is a perspective view of first electrode pads 18, first wiring patterns 12, first vias 20, and second wiring patterns 14 according to the first embodiment, indicating only an area indicated by IV in FIG. 1.

In the description that follows, a first mounting surface P1 on which to mount an electronic part 50 such as, for example, a semiconductor device is defined as the rear side, and a second mounting surface P2 to be mounted on an external circuit substrate 60 such as, for example, a motherboard is defined as the front side. The main surface of the mounting surface P1, which is a constituent component of the first mounting surface P1, is defined as the rear surface, and the main surface of the second mounting surface P2, which is a constituent component of the mounting surface P2, is defined as the front surface.

As illustrated in FIGS. 1 to 3, the circuit substrate 10 is a so-called single-sided multilayer substrate used as an interposer substrate. The circuit substrate 10 includes a first insulating layer 11, the first wiring patterns 12 placed on the front surface of the first insulating layer 11, a second insulating layer 13 placed on the front surface of the first insulating layer 11 to cover the first wiring patterns 12, the second wiring patterns 14 placed on the front surface of the second insulating layer 13, a third insulating layer 15 placed on the front surface of the second insulating layer 13 to cover the second wiring patterns 14, third wiring patterns 16 placed on the front surface of the third insulating layer 15, a fourth insulating layer 17 placed on the front surface of the third insulating layer 15 to cover the third wiring patterns 16, the first electrode pads 18 embedded in the first insulating layer 11, each of which is connected to a terminal 52 formed on a main body 51 of the electronic part 50 such as, for example, a semiconductor device, and second electrode pads 19 placed on the front surface of the fourth insulating layer 17, each of which is used as an external connection terminal connected to an electrode pad 62 formed on a main body 61 of the external circuit substrate 60 such as, for example, a motherboard.

In addition, the circuit substrate 10 includes first vias 20 embedded in the second insulating layer 13, each of which electrically interconnects the relevant first wiring pattern 12 and relevant second wiring patterns 14, second vias 21 embedded in the third insulating layer 15, each of which electrically interconnects the relevant second wiring pattern 14 and relevant third wiring pattern 16, and third vias 22 embedded in the fourth insulating layer 17, each of which electrically interconnects the relevant third wiring patterns 16 and relevant second electrode pad 19. The circuit substrate 10 may include solder resists 23 placed on the front surface of the fourth insulating layer 17, as appropriate.

These components will be individually described below in detail.

The first insulating layer 11, second insulating layer 13, third insulating layer 15, and fourth insulating layer 17 will be first described.

The first insulating layer 11, second insulating layer 13, third insulating layer 15, and fourth insulating layer 17 are each made of, for example, thermosetting epoxy resin. The first insulating layer 11 is formed so as to be thinner than the second insulating layer 13, third insulating layer 15, and fourth insulating layer 17. In this embodiment, the first insulating layer 11 is about 20 μm to 25 μm thick, and the second insulating layer 13, third insulating layer 15, and fourth insulating layer 17 are each about 50 μm thick.

The front surface of the first insulating layer 11 is coarser than the rear surface of the first insulating layer 11. In this embodiment, the surface roughness of the front surface of the first insulating layer 11 is about 0.4 Ra to 0.5 Ra, and the surface roughness of the rear surface of the first insulating layer 11 is about 0.2 Ra to 0.3 Ra.

Next, the first wiring patterns 12, second wiring patterns 14, and third wiring patterns 16 will be described.

Each first wiring pattern 12 has a wiring part 12a and a connecting part 12b. The wiring part 12a is a fine linear pattern directly connected to the first electrode pad 18. In this embodiment, the wiring part 12a is 5 μm to 10 μm wide, for example. The connecting part 12b, which is linked to the relevant wiring part 12a, is a round pattern wider than the wiring part 12a. In this embodiment, the connecting part 12b is 100 μm to 120 μm in diameter, for example.

Each second wiring pattern 14 has a wiring part 14a and two connecting parts 14b, and each third wiring patterns 16 has a wiring part 16a and two connecting parts 16b. The wiring part 14a and wiring part 16a are each a fine linear pattern. In this embodiment, the wiring part 14a and wiring part 16a are 5 μm to 10 μm wide, for example. The connecting parts 14b, which are linked to the two ends of the wiring part 14a, are each a round pattern wider than the wiring part 14a. The connecting parts 16b, which are linked to the two ends of the wiring part 16a, are each also a round pattern wider than the wiring part 16a. In this embodiment, the connecting part 14b and connecting part 16b are 100 μm to 120 μm in diameter, for example.

Although there is no particular limitation on the thicknesses of the first wiring pattern 12, second wiring pattern 14, and third wiring pattern 16, these thicknesses are about 25 μm in this embodiment. Although there is no particular limitation on the materials of the first wiring pattern 12, second wiring pattern 14, and third wiring pattern 16, they may be formed of a metal such as Cu, for example.

Next, the first electrode pad 18 will be described.

The first electrode pads 18, each of which is formed in a rectangular shape, are placed in parallel to the sides of the first insulating layer 11, one row of first electrode pads 18 being placed along each side of the first insulating layer 11. Although, in this embodiment, one row of first electrode pads 18 is placed along each side of the first insulating layer 11, two rows may be placed instead.

The first electrode pad 18, which extends through the first insulating layer 11, has a first end surface 18a connected to the relevant first wiring pattern 12, and also has a second end surface 18b exposed on the rear surface of the first insulating layer 11.

The first end surface 18a is directly connected to the wiring part 12a of the relevant first wiring pattern 12. Specifically, the first end surface 18a is connected to the rear surface of the wiring part 12a of the first wiring pattern 12. The first end surface 18a may sometimes slightly protrude from the front surface of the first insulating layer 11.

The second end surface 18b is an internal connection terminal that is connected to a terminal 52 of the electronic part 50 such as, for example, a semiconductor device. The second end surface 18b is positioned at the same height as the rear surface of the first insulating layer 11. Therefore, the second end surface 18b and the rear surface of the first insulating layer 11 form one flat surface as the first mounting surface P1 on which to mount the electronic part 50. Although, in this embodiment, the second end surface 18b is exposed on the rear surface of the first insulating layer 11, the second end surface 18b may be covered with a preliminary solder 24. The preliminary solder 24 is used to connect a terminal 52 of the electronic part 50 such as, for example, a semiconductor device to the first electrode pad 18.

A pitch between first electrode pads 18 is determined according to the pitch between terminals 52 of the electronic part 50. In this embodiment, the pitch between first electrode pads 18 is 20 μm to 40 μm, for example. Although there is no particular limitation on the thickness of the first electrode pad 18, the thickness is about 25 μm in this embodiment. The width of the first electrode pad 18 in the pitch direction of the placement of the first electrode pads 18 is preferably smaller than the width of the wiring part 12a of the first wiring pattern 12. In this embodiment, the width of the first electrode pad 18 is 10 μm to 20 μm, for example. The number of first electrode pads 18 is equal to the number of terminals 52 of the electronic part 50.

Next, the second electrode pad 19 will be described.

The second electrode pads 19, each of which is formed in a rectangular shape, are placed on the front surface of the fourth insulating layer 17 in matrix form. A solder ball B may be attached to each second electrode pad 19, as appropriate. The solder ball B is used when the second electrode pad 19 is connected to the electrode pad 62 formed on the main body 61 of the external circuit substrate 60 such as, for example, a motherboard.

A pitch between second electrode pads 19 is determined according to the pitch between electrode pads 62 of the external circuit substrate 60 such as, for example, a motherboard. In this embodiment, the pitch between second electrode pads 19 is 100 μm to 200 μm, for example. Although there is no particular limitation on the thickness of the second electrode pad 19, the thickness is about 25 μm in this embodiment. The width of the second electrode pad 19 in the pitch direction of the placement of the second electrode pads 19 is larger than the width of the first electrode pad 18 in the pitch direction of the placement of the first electrode pads 18. In this example, the width of the second electrode pad 19 is 50 μm to 100 μm, for example. The number of second electrode pads 19 is equal to the number of electrode pads 62 of the external circuit substrate 60.

Next, the first via 20, second via 21, and third via 22 will be described.

The first via 20 is formed in a circular truncated cone shape in such a way that its via diameter is reduced as the first via 20 comes closer to the first insulating layer 11. The first via 20 is in contact with both the front surface of the connecting part 12b of the relevant first wiring pattern 12 and the rear surface of the connecting part 14b of the relevant second wiring pattern 14.

The second via 21 is formed in a circular truncated cone shape in such a way that its via diameter is reduced as the second via 21 comes closer to the second insulating layer 13. The second via 21 is in contact with both the front surface of the connecting part 14b of the relevant second wiring pattern 14 and the rear surface of the connecting part 16b of the relevant third wiring pattern 16.

The third via 22 is formed in a circular truncated cone shape in such a way that its via diameter is reduced as the third via 22 comes closer to the third insulating layer 15. The third via 22 is in contact with both the front surface of the connecting part 16b of the relevant third wiring pattern 16 and the rear surface of the relevant second electrode pad 19.

As described above, the first wiring patterns 12, second wiring patterns 14, third wiring patterns 16, and second electrode pads 19 are mutually connected through any of the first vias 20, second vias 21, and third vias 22.

In contrast, the first electrode pad 18 is directly connected to the rear surface of the wiring part 12a of the relevant first wiring pattern 12. Specifically, the first end surface 18a of the first electrode pad 18 is in contact with the rear surface of the wiring part 12a of the first wiring pattern 12. Accordingly, the circuit substrate 10 according to this embodiment has no via that electrically connects the first electrode pad 18 and first wiring pattern 12 to each other.

Next, the solder resist 23 will be described.

When a solder material supplied to the front surface of the second electrode pad 19 melts, the solder resists 23 suppress the solder material from spreading from the second electrode pad 19. Each solder resist 23 has a pad opening 23a at a position corresponding to the relevant second electrode pad 19 so that the second electrode pad 19 is exposed from the pad opening 23a. Although it suffices to make the thickness of the solder resist 23 equal to or larger than the thickness of the second electrode pad 19, the thickness of the solder resist 23 is 30 μm to 50 μm, for example in this embodiment. The solder resist 23 may be formed of a thermosetting polyimide resin, thermosetting epoxy resin, or photo-curable resin.

Processes of manufacturing the circuit substrate 10

FIGS. 5 to 27 illustrate processes of manufacturing the circuit substrate 10 according to the first embodiment. FIGS. 5 to 24 illustrate a large substrate before the circuit substrate 10 according to this embodiment is segmented. For the purpose of simplifying FIGS. 5 to 24, break lines are omitted.

Figure 5:
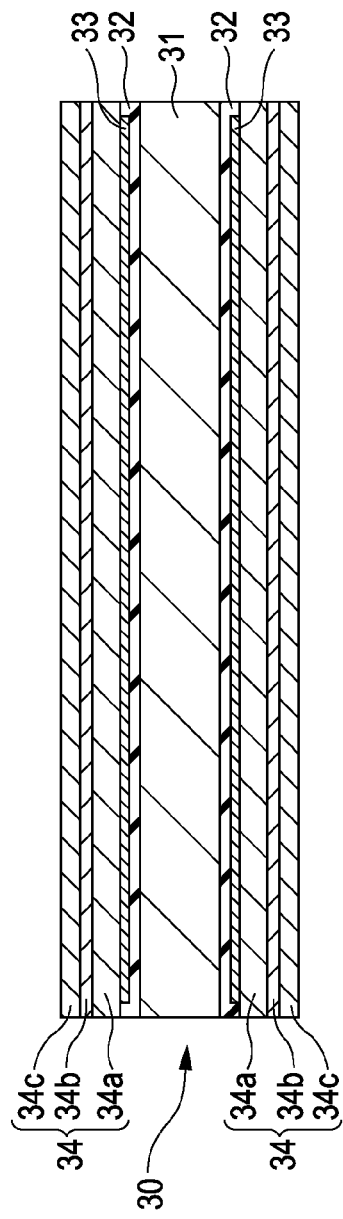
FIG. 5 illustrates a process of manufacturing the circuit substrate according to the first embodiment.

As illustrated in FIG. 5, a support substrate 30 used in the manufacturing of the circuit substrate 10 according to this embodiment is first manufactured. The manufacturing of the support substrate 30 begins with the forming of an insulating layer 32, a small Cu foil 33, and a Cu—Ni—Cu laminated foil 34 on both surfaces of a so-called heat-resistant glass woven epoxy resin based copper clad laminate 31 (FR-4: flame retardant type 4), which is formed by, for example, impregnating an epoxy resin into a glass cloth, in that order from the surfaces of the heat-resistant glass woven epoxy resin based copper clad laminate 31. The insulating layer 32 may be formed of an epoxy resin or polyimide resin. Although there is no particular limitation on the thickness of the insulating layer 32, the insulating layer 32 is thicker than at least the small Cu foil 33 because the thickness of the small Cu foil 33 preferably falls within the thickness of the insulating layer 32. The planar size of the small Cu foil 33 is smaller than the planar size of the insulating layer 32. Accordingly, the insulating layer 32 is exposed from the circumference of the small Cu foil 33. The insulating layer 32 exposed from the circumference of the small Cu foil 33 will be referred to below as an exposed area 32a. Although there is no particular limitation on the size of the small Cu foil 33, each side of the small Cu foil 33 is about 6 cm smaller than each side of the insulating layer 32 in this embodiment, that is, the width of the exposed area 32a of the insulating layer 32, is about 3 cm. Although there is no particular limitation on the thickness of the small Cu foil 33, it is 12 μm, for example, in this embodiment. Although there are no particular limitations on the thicknesses of the individual layers of the laminated foil 34, that is, a Cu layer 34a, a Ni layer 34b, and a Cu layer 34c, the thicknesses of the Cu layer 34a, Ni layer 34b, and Cu layer 34c are respectively 100 μm, 0.8 μm, and 25 μm. The surface roughness of the Ni layer 34b is about 0.2 Ra to 0.3 Ra.

Next, the heat-resistant glass woven epoxy resin based copper clad laminate 31, insulating layer 32, small Cu foil 33, and Cu—Ni—Cu laminated foil 34 are thermally compressed by being pressed in a vacuum. The exposed area 32a of the insulating layer 32, which is exposed from the circumference of the small Cu foil 33, is press-fitted to the Cu—Ni—Cu laminated foil 34. At that time, the small Cu foil 33 is not press-fitted to the Cu—Ni—Cu laminated foil 34, but the exposed area 32a of the insulating layer 32 is deformed like a bag, the interior of which is vacuated. Accordingly, the small Cu foil 33 is adsorbed to the Cu—Ni—Cu laminated foil 34. In the thermo compression by pressing, a vacuum laminator may be used, for example. In this case, the degree of vacuum is 0.2 MPa to 0.5 Mpa, for example.

Figure 6:
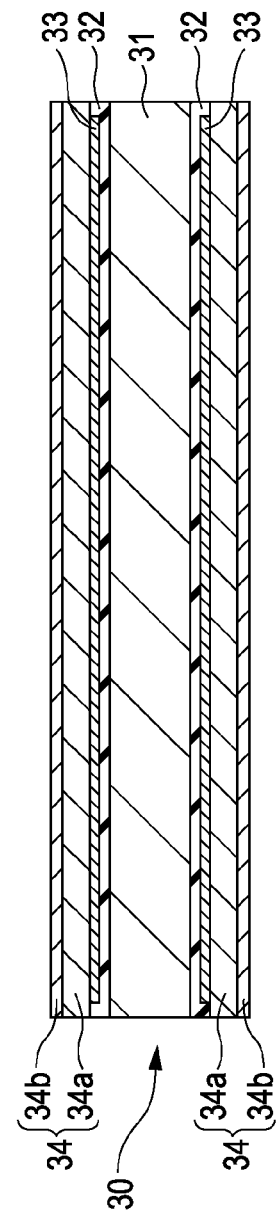
FIG. 6 illustrates a process of manufacturing the circuit substrate according to the first embodiment.

Next, the Cu layer 34c of the laminated foil 34, which is exposed on each surface of the support substrate 30, is removed by, for example, wet etching to expose the Ni layer 34b of the laminated foil 34, as illustrated in FIG. 6. Although there is no particular limitation on an etchant, an ammonia alkaline solution may be used.

Figure 7:
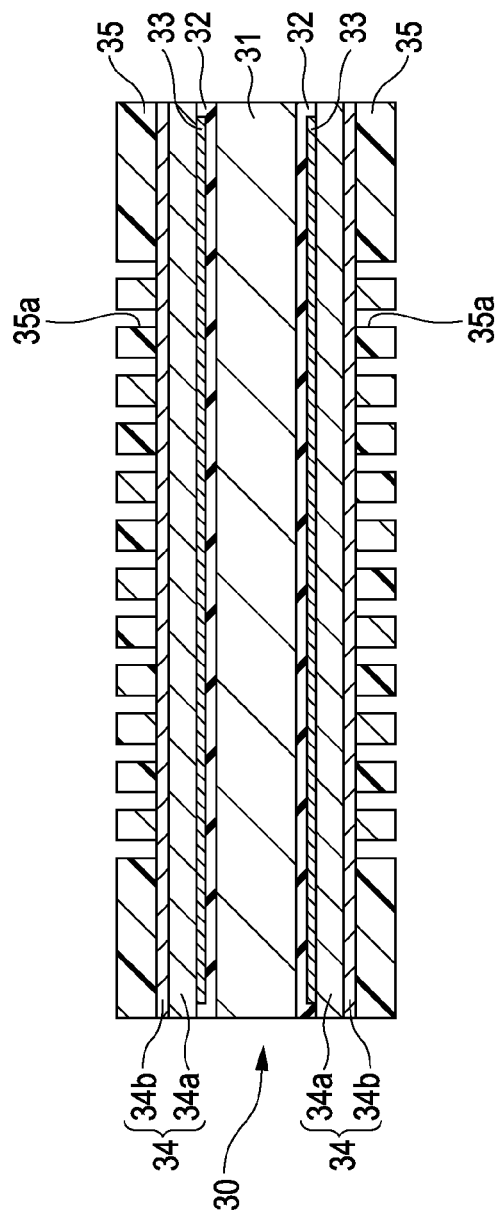
FIG. 7 illustrates a process of manufacturing the circuit substrate according to the first embodiment.

Next, a photosensitive film 35 is attached to the front surface of the Ni layer 34b exposed on each surface of the support substrate 30 by thermal compression, as illustrated in FIG. 7. Although there is no particular limitation on the thickness of the photosensitive film 35, it is set to 25 μm, for example, in this embodiment. Next, an exposure mask (not illustrated) is used to expose the photosensitive film 35, and an exposure pattern area is formed on the photosensitive film 35 in correspondence to each first electrode pad 18. A developing solution is then supplied to the photosensitive film 35 to remove the exposure pattern area from the photosensitive film 35. An opening 35a is formed in the photosensitive film 35 in correspondence to each first electrode pad 18, in this way.

Figure 8:
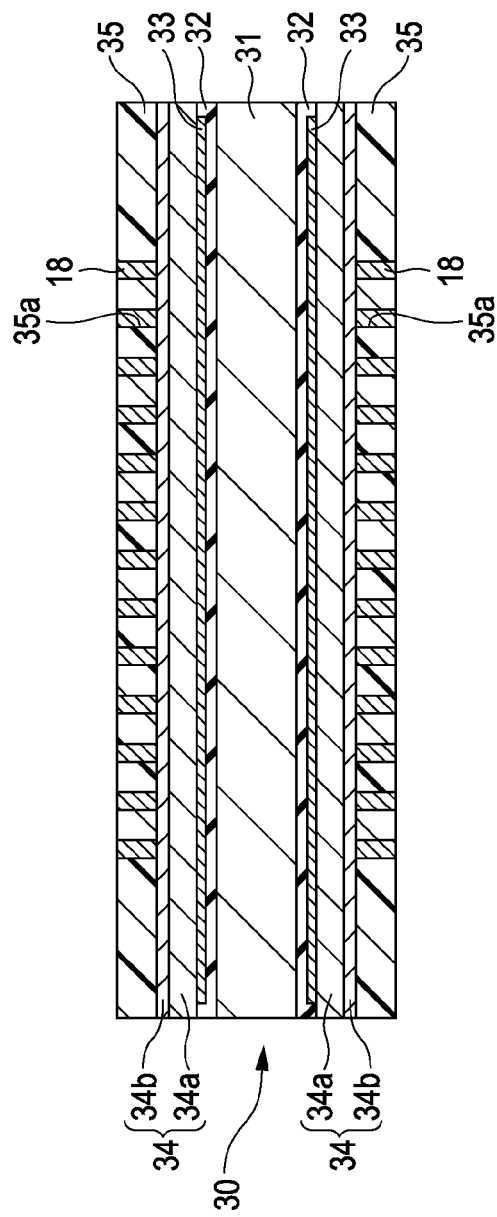
FIG. 8 illustrates a process of manufacturing the circuit substrate according to the first embodiment.

Next, a Cu layer is deposited in each opening 35a in the photosensitive film 35 by electrolytic plating in which the Ni layer 34b is used as a power feed layer to form the first electrode pad 18 on the front surface of the Ni layer 34b, as illustrated in FIG. 8. Electrolytic plating is continued until the thickness of the Cu layer becomes equal to the thickness of the photosensitive film 35.

Figure 9:
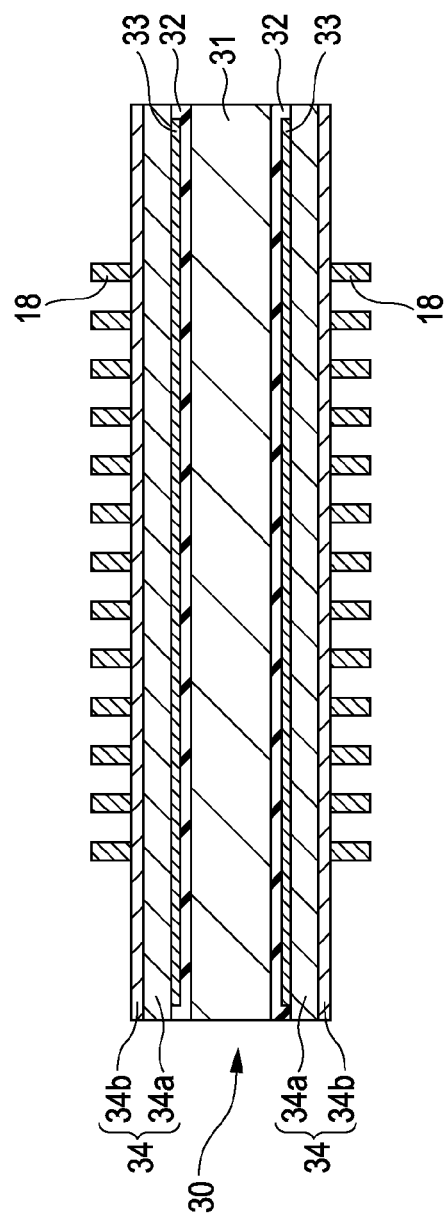
FIG. 9 illustrates a process of manufacturing the circuit substrate according to the first embodiment.

Next, a chemical solution is supplied to the photosensitive film 35 to remove the photosensitive film 35 from the Ni layer 34b, as illustrated in FIG. 9. The type of chemical solution may be determined according to the type of photosensitive film 35. After the photosensitive film 35 has been removed, a cleaning process to remove the chemical solution may be added.

Figure 10:
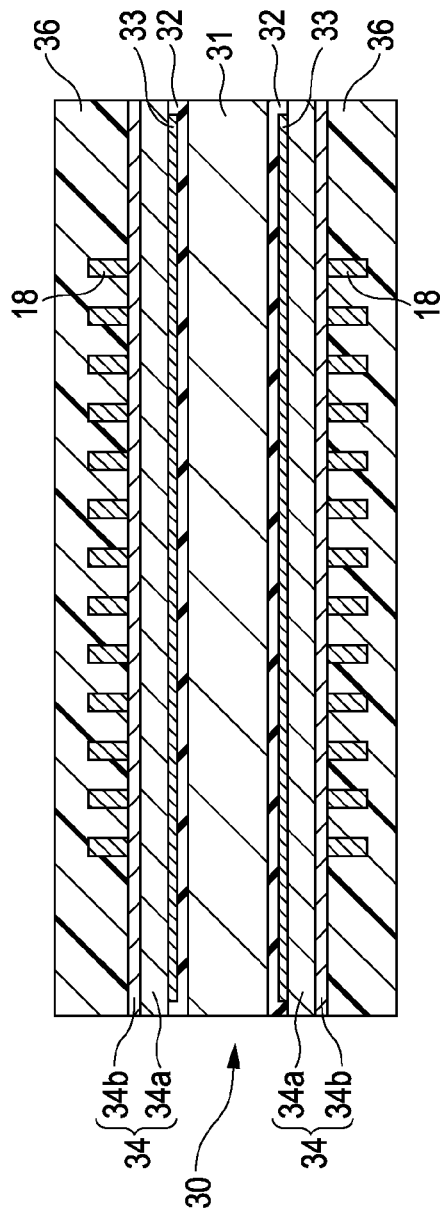
FIG. 10 illustrates a process of manufacturing the circuit substrate according to the first embodiment.

Next, an epoxy insulting sheet 36 is attached to the Ni layer 34b exposed on each surface of the support substrate 30 in a vacuum to cover the first electrode pads 18, as illustrated in FIG. 10. Although there is no particular limitation on the epoxy insulting sheet 36 if it is thicker than the first electrode pad 18, the epoxy insulting sheet 36 is preferably 10 μm, for example, thicker than the first electrode pad 18 so that at least a spacing between the first electrode pads 18 is adequately filled.

Figure 11:
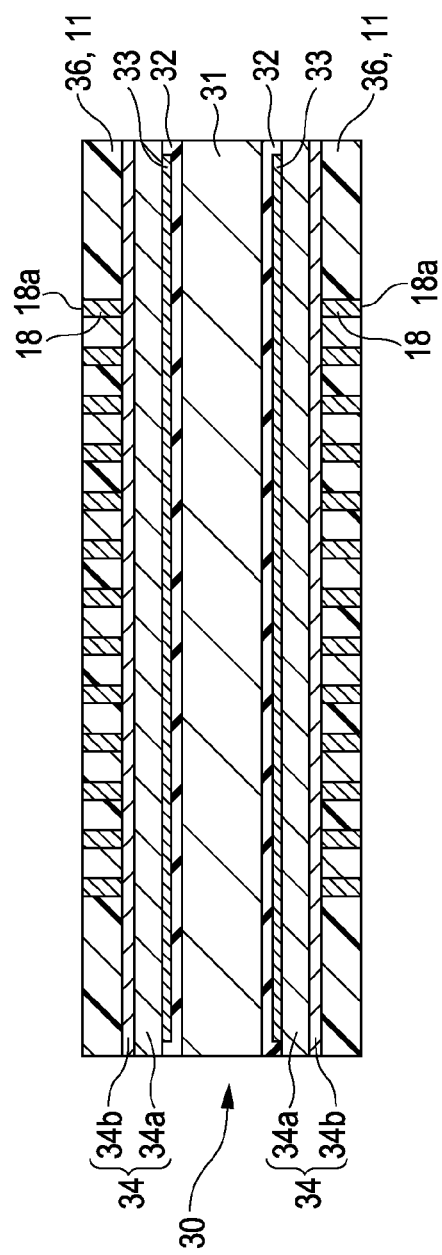
FIG. 11 illustrates a process of manufacturing the circuit substrate according to the first embodiment.

Next, the front surface of the epoxy insulting sheet 36 is polished to expose the front surface of each first electrode pad 18, as illustrated in FIG. 11. Upon the completion of polishing, the epoxy insulting sheet 36 becomes the first insulating layer 11 of the circuit substrate 10. The front surface of the first electrode pad 18 exposed from the epoxy insulting sheet 36 becomes the first end surface 18a connected to the relevant first wiring pattern 12. If the epoxy insulting sheet 36 remains on the front surface of the first electrode pad 18, a connection failure may be caused between the first electrode pad 18 and the first wiring pattern 12. After the front surface of the first electrode pad 18 has been exposed, therefore, it is preferable to additionally polish the surface of the first electrode pad 18 by several μm, for example, 5 μm. Since, however, the epoxy insulting sheet 36 has a higher polishing rate than the first electrode pad 18, however, if the front surface of the first electrode pad 18 is additionally polished, the epoxy insulting sheet 36 is more polished than the first electrode pad 18. Therefore, the front surface of the first electrode pad 18 may slightly protrude from the front surface of the first insulating layer 11. Although there is no particular limitation on the method of polishing the epoxy insulting sheet 36, belt polishing may be used, for example. When the front surface of the epoxy insulting sheet 36 is polished, chips of the material of the first electrode pad 18, that is, chips of Cu, are generated, which may cause a short-circuit between wiring patterns. After the epoxy insulting sheet 36 has been polished, therefore, wet etching may be carried out to remove the chips from the front surface of the epoxy insulting sheet 36. A mixed solution of sulfuric acid and hydrogen peroxide may be used as the etchant, for example. The amount of etching may be 1 μm, for example.

Figure 12:
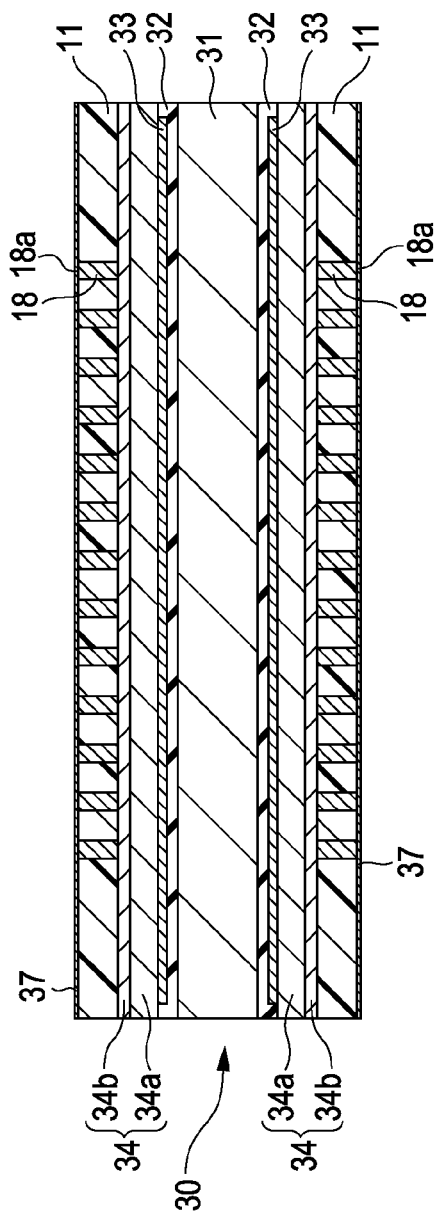
FIG. 12 illustrates a process of manufacturing the circuit substrate according to the first embodiment.

Next, a seed metal layer 37 is formed on the front surfaces of the first insulating layer 11 and first electrode pad 18, that is, on the first end surface 18a, by, for example, non-electrolytic plating, as illustrated in FIG. 12. The seed metal layer 37 may be formed of a metal such as, for example, Cu. Although there is no particular limitation on the thickness of the seed metal layer 37, it is 0.1 μm to 1 μm, for example, in this embodiment.

Figure 13:
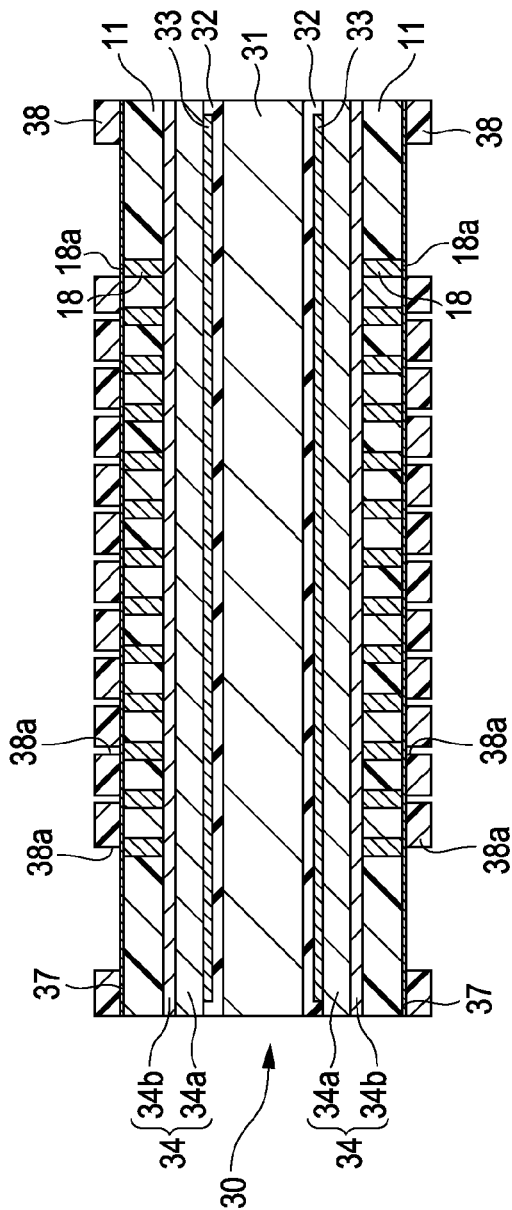
FIG. 13 illustrates a process of manufacturing the circuit substrate according to the first embodiment.

Next, a photosensitive film 38 is attached to the front surface of each seed metal layer 37 by thermal compression, as illustrated in FIG. 13. Although there is no particular limitation on the thickness of the photosensitive film 38, it is set to about 25 μm, for example, in this embodiment. Next, an exposure mask (not illustrated) is used to expose the photosensitive film 38 and then form exposure pattern areas, on the photosensitive film 38, each of which corresponds to one first wiring pattern 12. A developing solution is then supplied to the photosensitive film 38 to remove the exposure pattern area from the photosensitive film 38. Openings 38a, each of which corresponds to one first wiring pattern 12, are then formed in the photosensitive film 38. The openings 38a formed in the photosensitive film 38 are formed not only on the front surface of the first insulating layer 11 but also on the front surfaces of the first electrode pads 18, that is, at the positions corresponding to the first end surfaces 18a.

Figure 14:
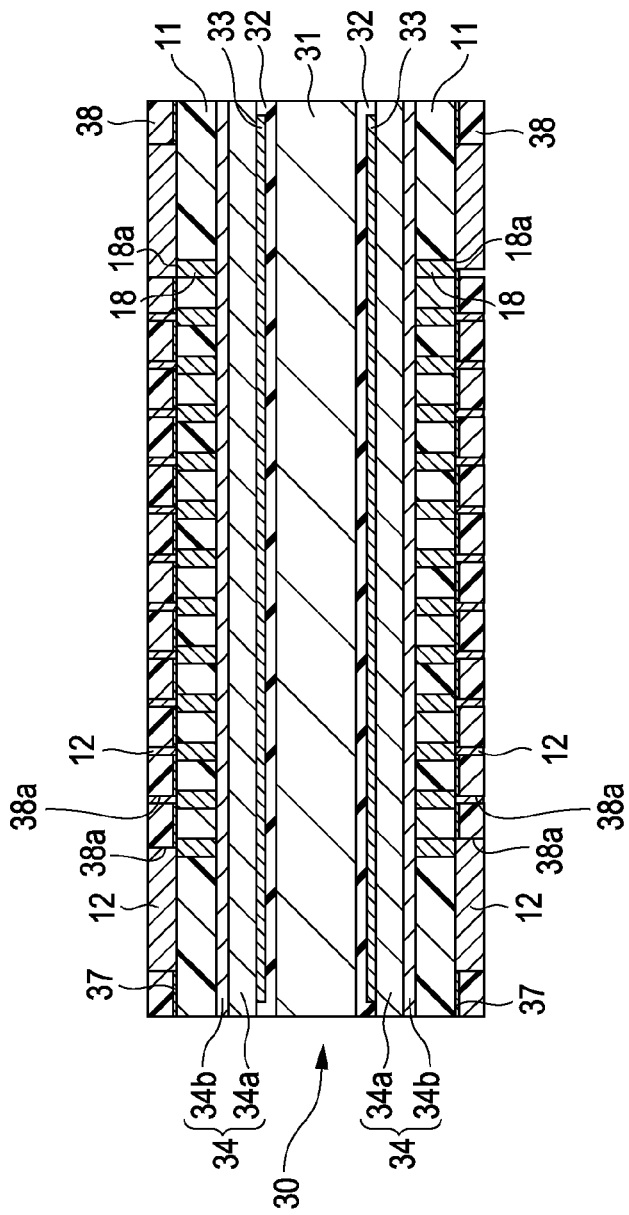
FIG. 14 illustrates a process of manufacturing the circuit substrate according to the first embodiment.

Next, a Cu layer is deposited in each opening 38a in the photosensitive film 38 by electrolytic plating in which the seed metal layer 37 is used as a power feed layer to form the first wiring pattern 12 on the front surface of the seed metal layer 37, as illustrated in FIG. 14. The first wiring pattern 12 directly connected to the relevant front surface of the first electrode pad 18, that is, the first end surface 18a, is formed on the front surface of the first insulating layer 11. Non-electrolytic plating is continued until the thickness of the Cu layer becomes equal to the thickness of the photosensitive film 38.

Figure 15:
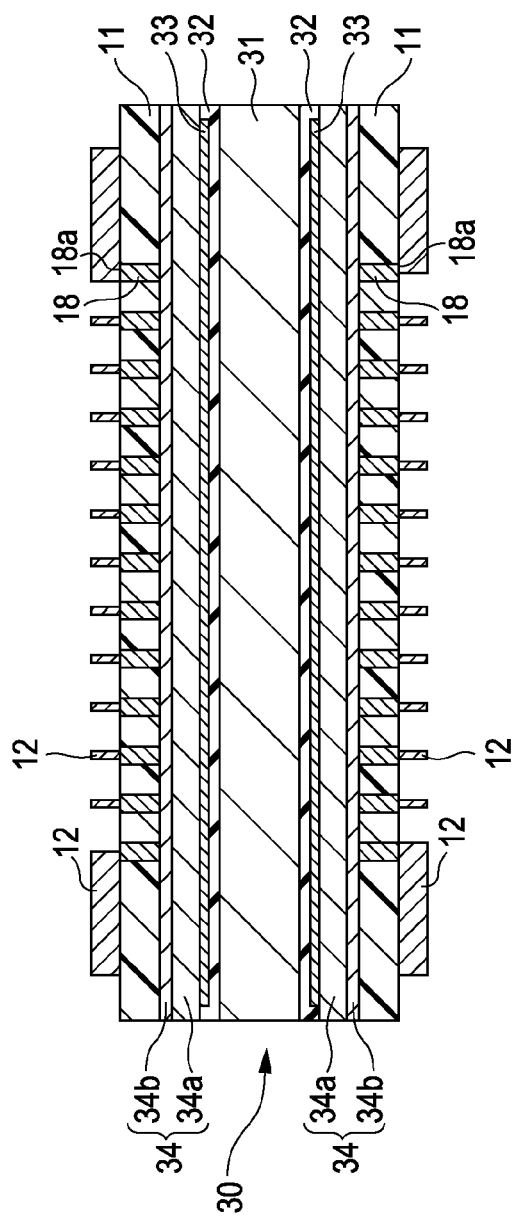
FIG. 15 illustrates a process of manufacturing the circuit substrate according to the first embodiment.

Next, a chemical solution is supplied to the photosensitive film 38 to remove the photosensitive film 38 from the first insulating layer 11, as illustrated in FIG. 15. The type of chemical solution may be determined according to the type of photosensitive film 38. After the photosensitive film 38 has been removed, a cleaning process to remove the chemical solution may be added. After the photosensitive film 38 has been removed, the seed metal layer 37 formed on the front surface of the first insulating layer 11 is removed by, for example, flash etching. Accordingly, the front surface of the first electrode pad 18, that is, the first end surface 18a, is exposed again.

Figure 16:
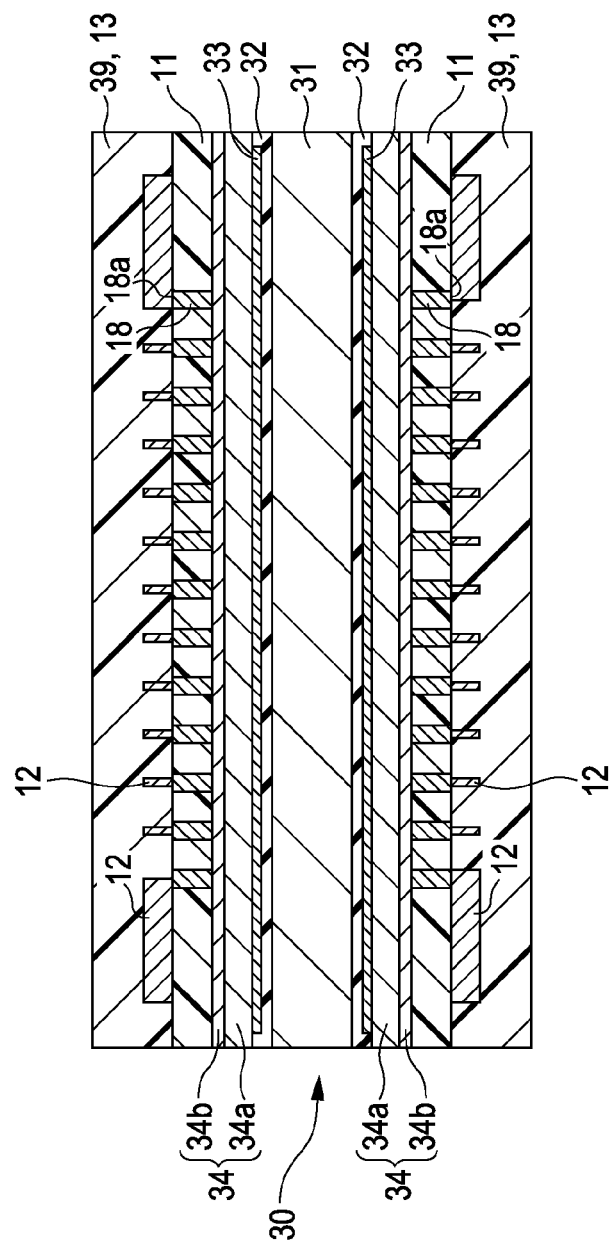
FIG. 16 illustrates a process of manufacturing the circuit substrate according to the first embodiment.

Next, an epoxy insulting sheet 39 is attached to the front surface of each first insulating layer 11 in a vacuum to cover the first wiring patterns 12, as illustrated in FIG. 16. Although there is no particular limitation on the epoxy insulting sheet 39 if it is thicker than at least the first wiring pattern 12, the thickness of the epoxy insulting sheet 39 is about 50 µm. The epoxy insulting sheet 39 attached to the front surface of the first insulating layer 11 becomes the second insulating layer 13 of the circuit substrate 10.

Figure 17:
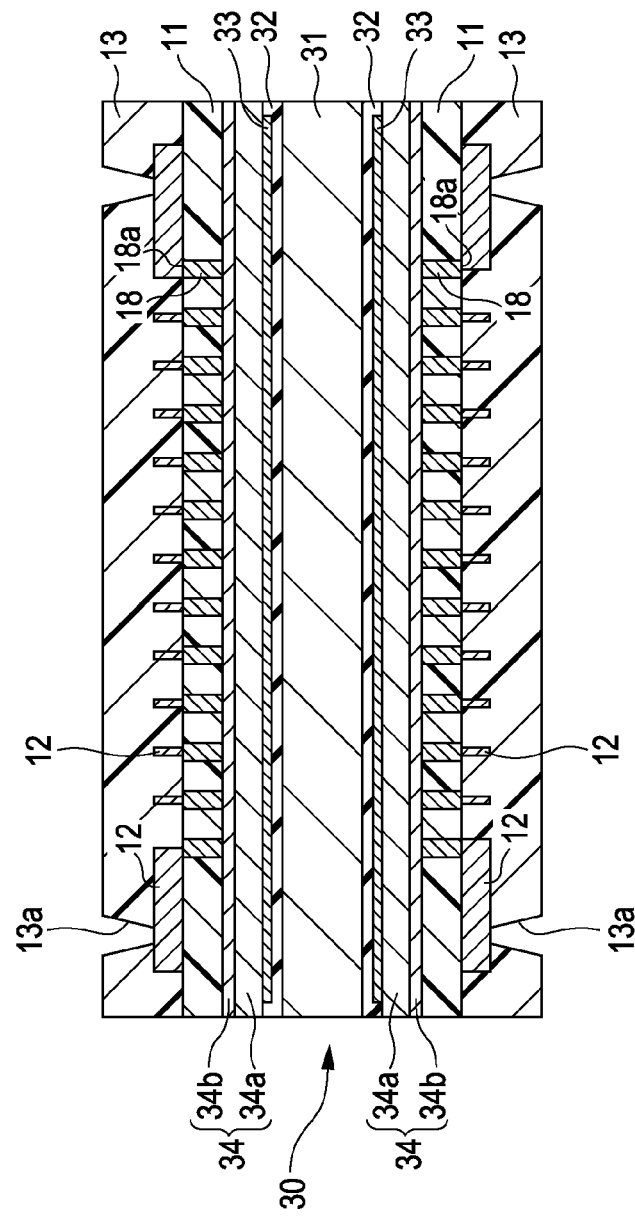
FIG. 17 illustrates a process of manufacturing the circuit substrate according to the first embodiment.

Next, a via hole 13a extending to the connecting part 12b of one first wiring pattern 12 is formed in the second insulating layer 13, as illustrated in FIG. 17. Laser machining, etching, or another type of machining may be used, for example, as the method of machining the via hole 13a. With laser machining or etching, the connecting part 12b of the first wiring pattern 12 may be used as a surface on which to stop machining. The via hole 13a has an internal surface in a cone shape, the diameter of which is gradually reduced as the internal surface comes closer to the relevant first wiring pattern 12. A $CO_2$ laser may be used, for example, as the laser. Laser machining may involve smears in the via hole 13a. Upon completion of laser machining, therefore, a chemical solution may be supplied to the second insulating layer 13 to remove the smears from the via hole 13a, as appropriate. A potassium permanganate solution may be used, for example, as the chemical solution.

Figure 18:
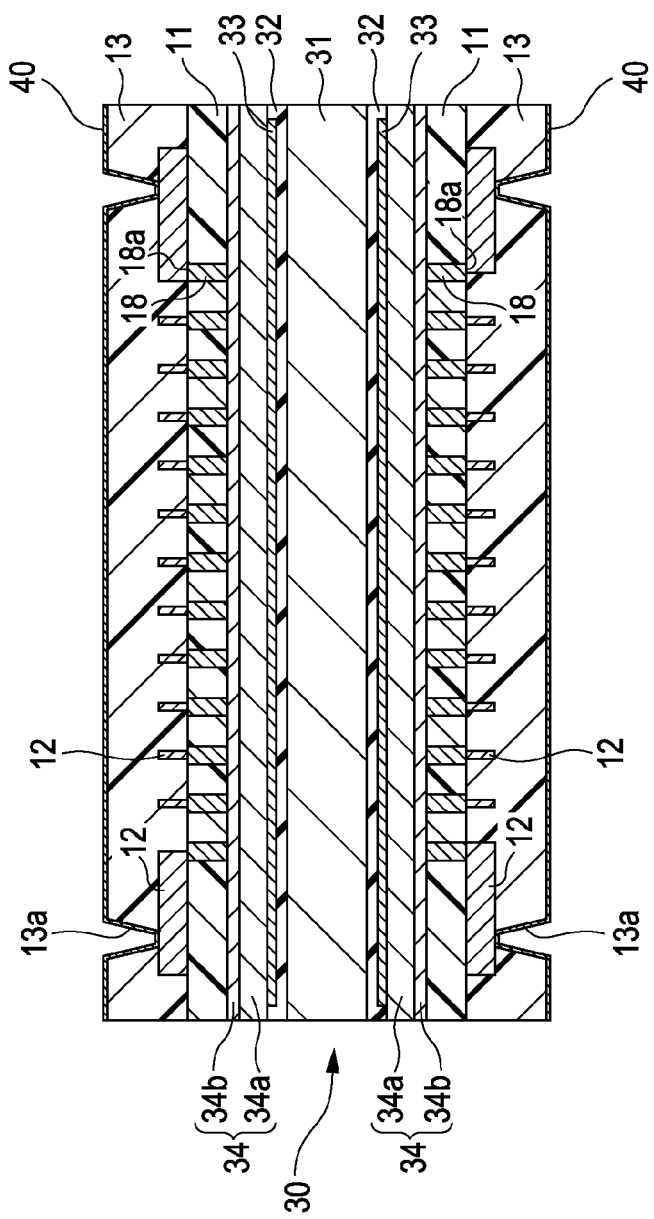
FIG. 18 illustrates a process of manufacturing the circuit substrate according to the first embodiment.

Next, a seed metal layer 40 is formed on the front surface of each second insulating layer 13, the internal surfaces of the via holes 13a, and the front surfaces of the first wiring patterns 12 exposed in the via holes 13a by, for example, non-electrolytic plating, as illustrated in FIG. 18. The seed metal layer 40 may be formed of a metal such as, for example, Cu. Although there is no particular limitation on the thickness of the seed metal layer 40, it is 0.1 µm to 1 µm, for example, in this embodiment.

Figure 19:
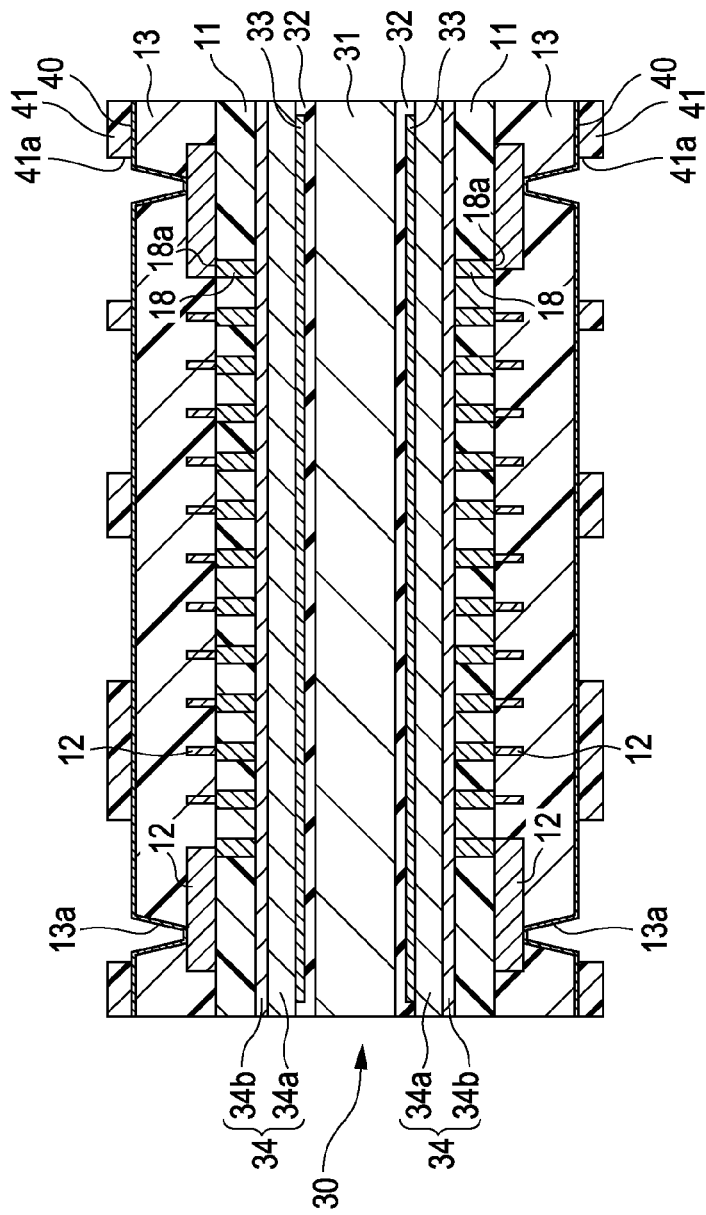
FIG. 19 illustrates a process of manufacturing the circuit substrate according to the first embodiment.

Next, a photosensitive film 41 is attached to the front surface of each seed metal layer 40 by thermal compression, as illustrated in FIG. 19. Although there is no particular limitation on the thickness of the photosensitive film 41, it is set to about 25 µm, for example, in this embodiment. Next, an exposure mask (not illustrated) is used to expose the photosensitive film 41 and then form exposure pattern areas, on the photosensitive film 41, each of which corresponds to one second wiring pattern 14. A developing solution is then supplied to the photosensitive film 41 to form openings 41a, each of which corresponds to one second wiring pattern 14. The openings 41a formed in the photosensitive film 41 are formed not only on the front surface of the second insulating layer 13 but also on the internal surfaces of the via holes 13a and the front surfaces of the first wiring patterns 12 exposed in the via holes 13a.

Figure 20:
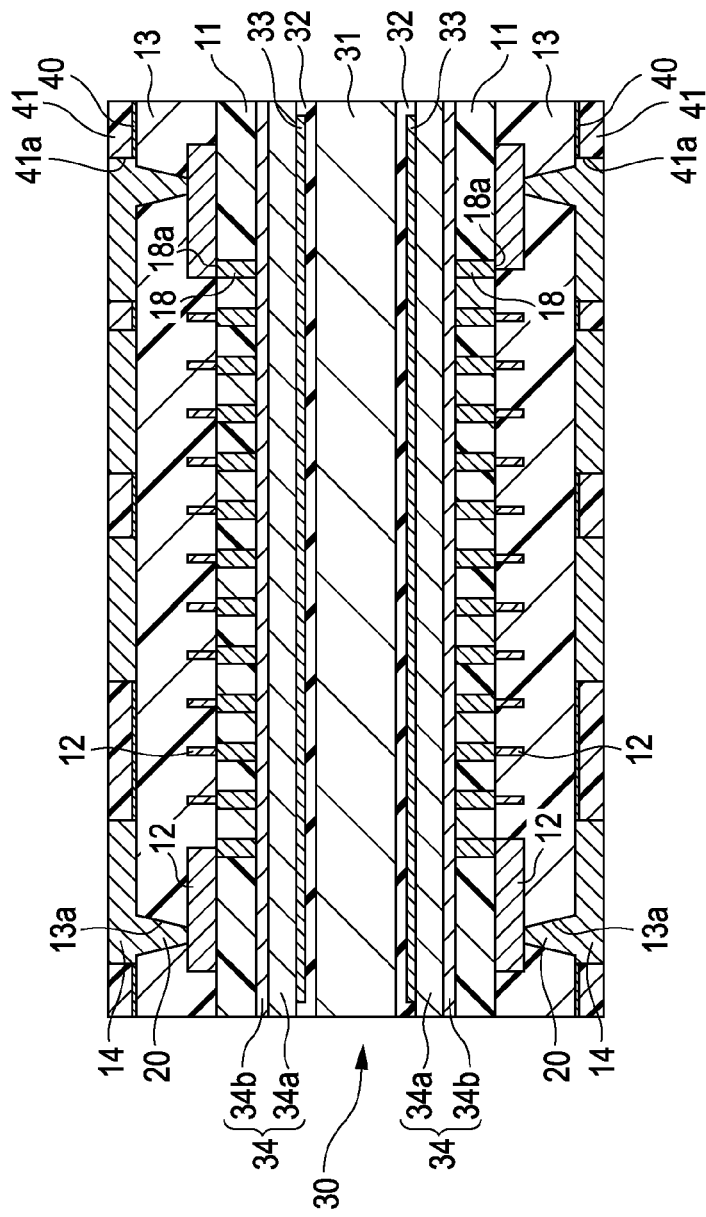
FIG. 20 illustrates a process of manufacturing the circuit substrate according to the first embodiment.

Next, a Cu layer is deposited in each opening 41a in the photosensitive film 41 by electrolytic plating in which the seed metal layer 40 is used as a power feed layer to form the second wiring pattern 14 on the front surface of the second insulating layer 13 and the first via 20 in the 13a simultaneously, as illustrated in FIG. 20. Electrolytic plating is continued until the thickness of the Cu layer becomes equal to the thickness of the photosensitive film 41.

Figure 21:
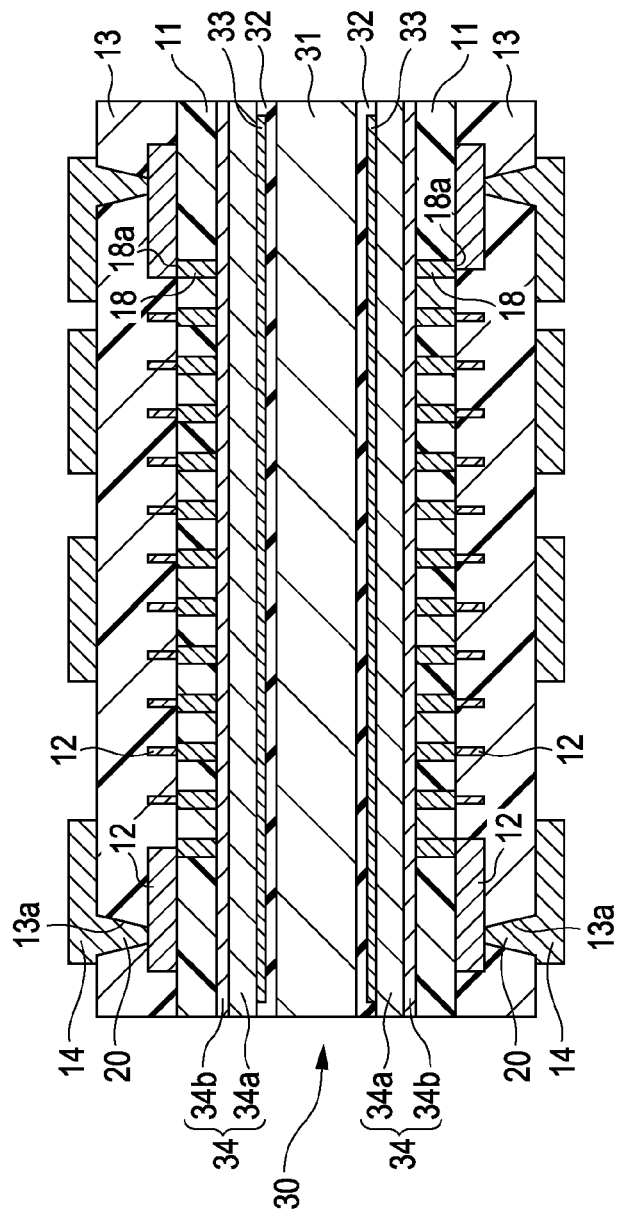
FIG. 21 illustrates a process of manufacturing the circuit substrate according to the first embodiment.

Next, a chemical solution is supplied to the photosensitive film 41 to remove the photosensitive film 41 from the front surface of the seed metal layer 40, as illustrated in FIG. 21. The type of chemical solution may be determined according to the type of photosensitive film 41. After the photosensitive film 41 has been removed, a cleaning process to remove the chemical solution may be added. After the photosensitive film 41 has been removed, the seed metal layer 40 formed on the front surface of the second insulating layer 13 is removed by, for example, flash etching.

Figure 22:
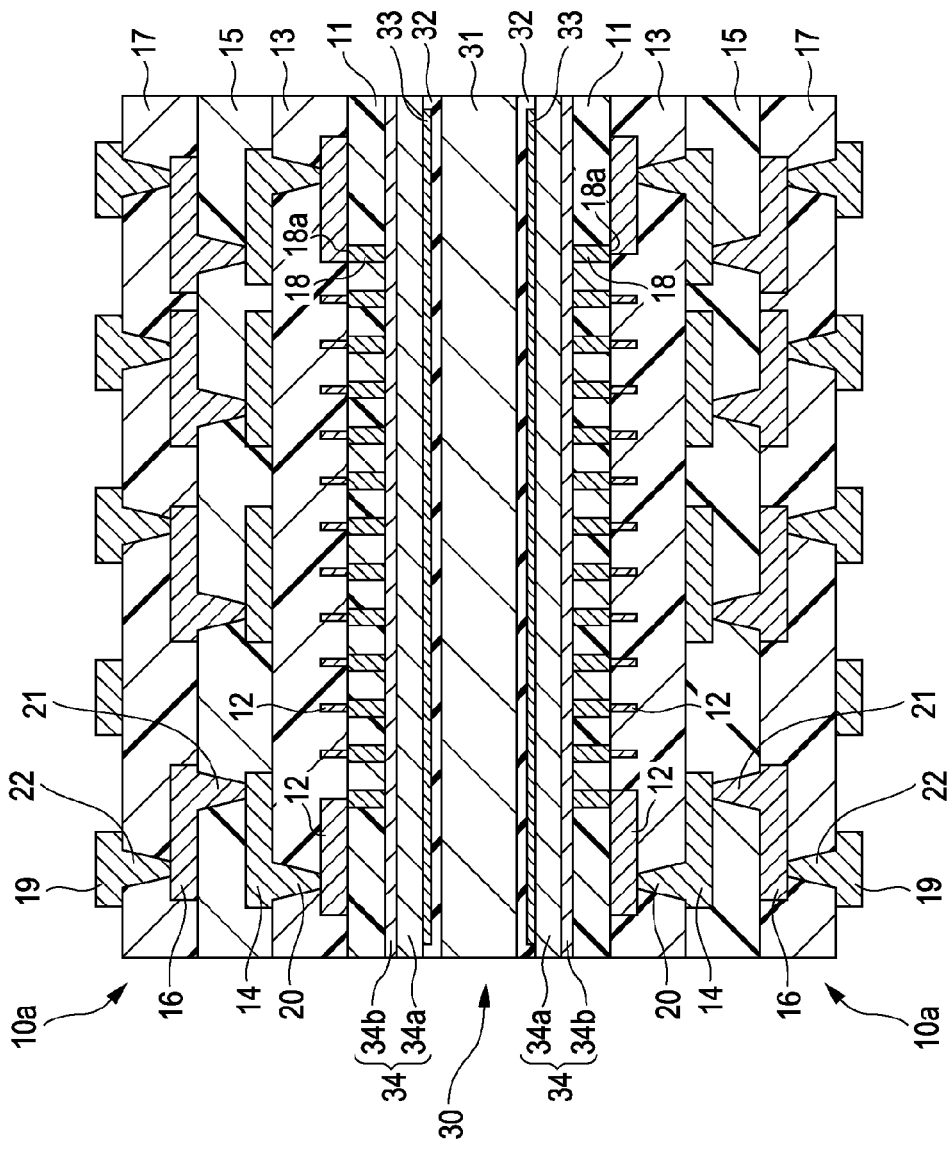
FIG. 22 illustrates a process of manufacturing the circuit substrate according to the first embodiment.

Upon the completion of the forming of the second patterns 14 though the above processes, the processes that have been described with reference to FIGS. 16 to 21 are repeated to form the third insulating layer 15 placed on the front surface of the second insulating layer 13 to cover the second wiring patterns 14, the third wiring patterns 16 formed on the front surface of the third insulating layer 15, each of which is connected to the relevant second wiring pattern 14 through the relevant second via 21, the fourth insulating layer 17 placed on the front surface of the third insulating layer 15 to cover the third wiring patterns 16, the second electrode pads 19 placed on the front surface of the fourth insulating layer 17, each of which is connected to the relevant third wiring pattern 16 through the relevant third via 22. As described above, a four-layer single-sided multilayer substrate 10a is formed on each side of the support substrate 30, as illustrated in FIG. 22.

Figure 23:
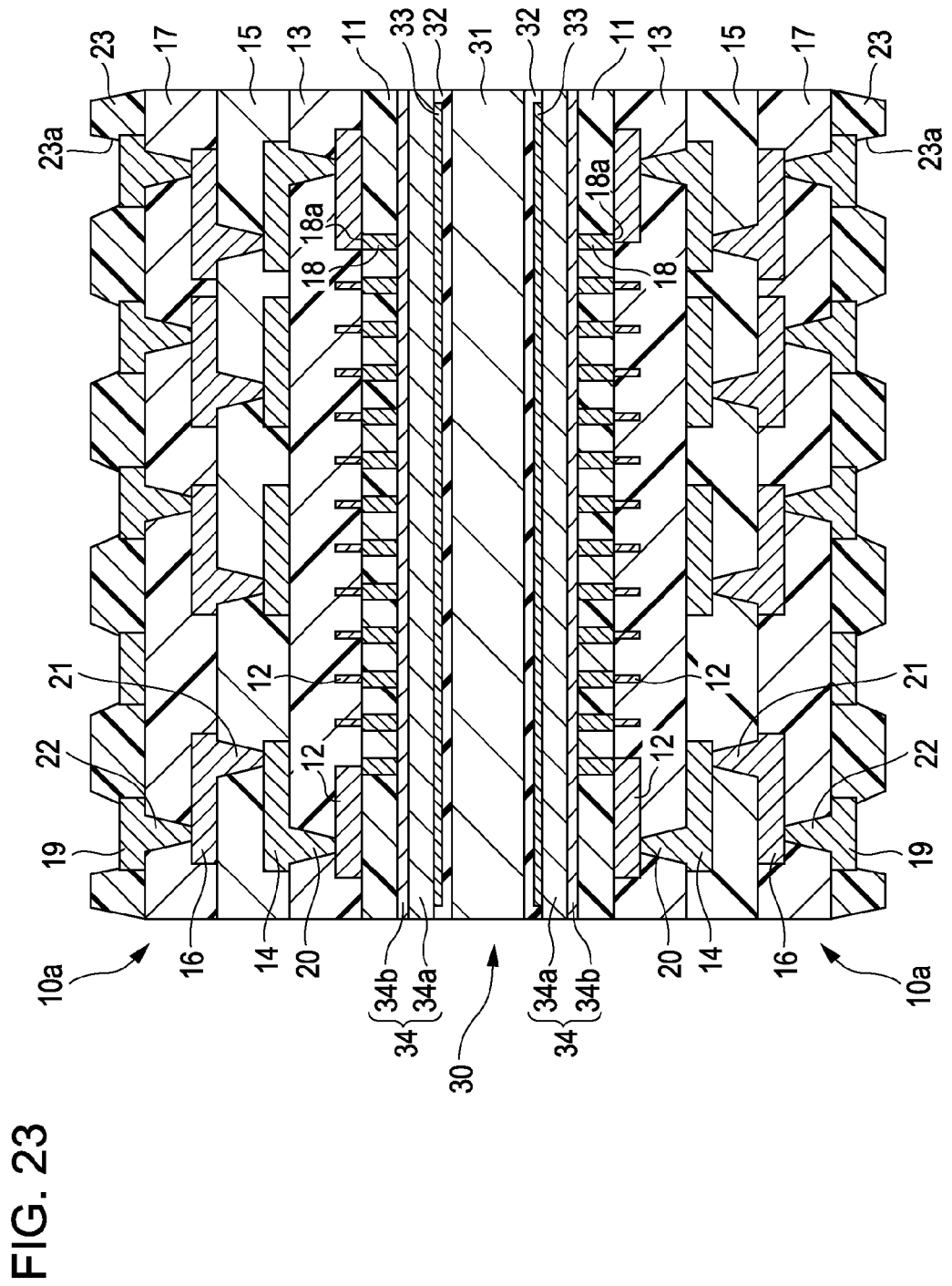
FIG. 23 illustrates a process of manufacturing the circuit substrate according to the first embodiment.

Next, the solder resist 23 may be formed on the front surface of each fourth insulating layer 17, as illustrated in FIG. 23. Although there is no particular restriction on the method of forming the solder resist 23, photolithography or screen printing may be used, for example. In photolithography, a liquid photosensitive material is first applied, after which the photosensitive material is dried and cured. The photosensitive material undergoes exposure and development to form the pad openings 23a, through which the second electrode pads 19 are exposed, at the positions corresponding to the second electrode pads 19. There is no particular limitation on the thickness of the solder resist 23 if the solder resist 23 is thicker than the second electrode pad 19.

Figure 24:
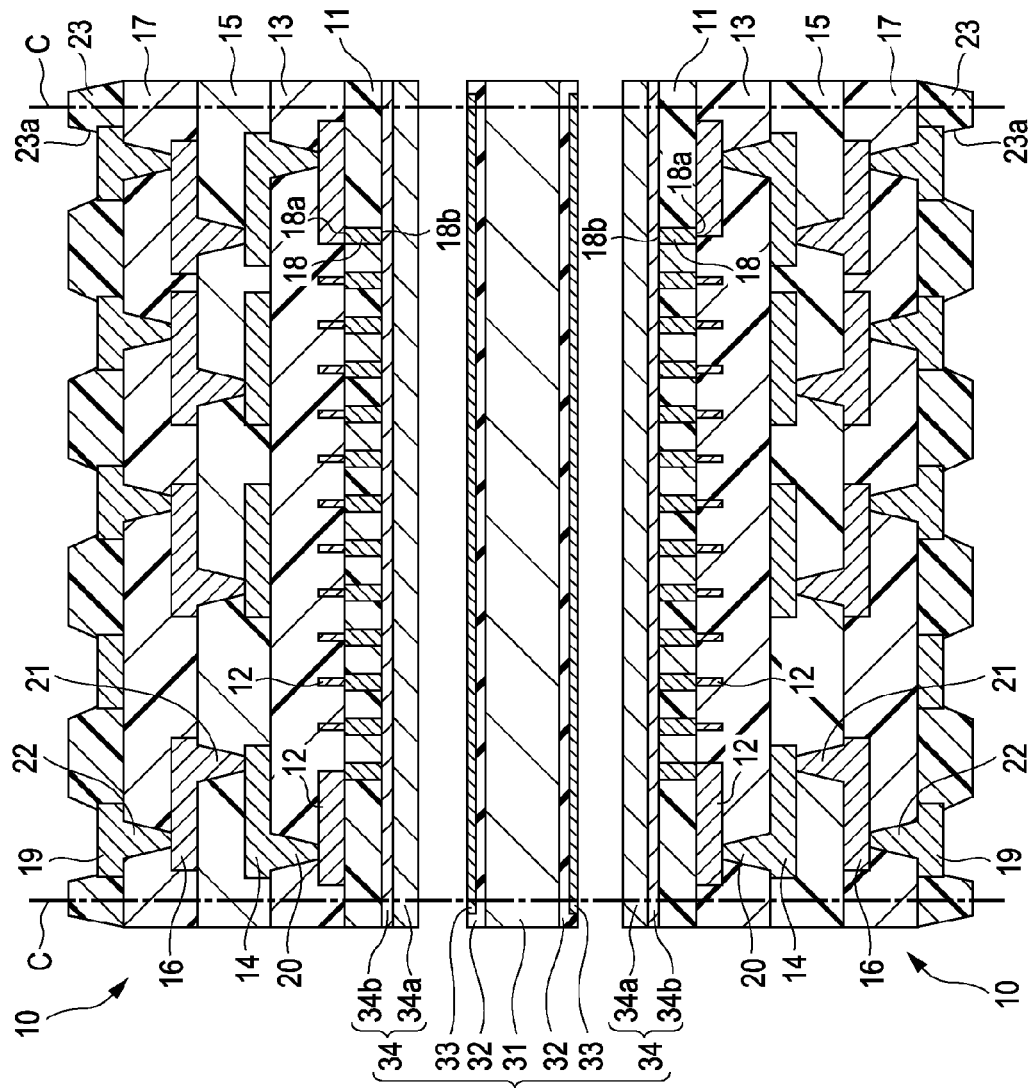
FIG. 24 illustrates a process of manufacturing the circuit substrate according to the first embodiment.

Next, the support substrate 30 and four-layer single-sided multilayer substrate 10a are cut by, for example, dicing as illustrated in FIG. 24. A dicing blade is positioned in such a way that it passes through the inside of the exposed area 32a on the insulating layer 32 of the support substrate 30, that is, the small Cu foil 33 is cut. The straight line C in the FIG. 24 indicates the path along which the dicing blade passes. Accordingly, the vacuum maintained in the spacing between the small Cu foil 33 and the Cu—Ni—Cu laminated foil 34 due to the press-fitting by the exposed area 32a on the insulating layer 32 and the laminated foil 34 is relieved, causing the laminated foil 34 to come off the insulating layer 32 and small Cu foil 33.

Figure 25:
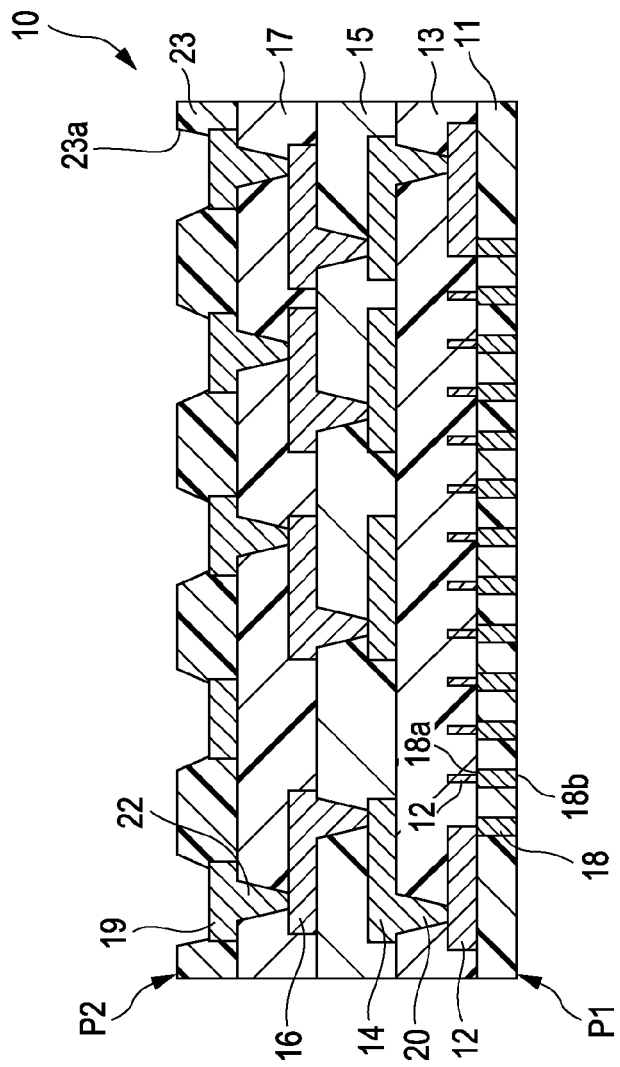
FIG. 25 illustrates a process of manufacturing the circuit substrate according to the first embodiment.

Next, residues of the support substrate 30, which are left on the rear surface of the four-layer single-sided multilayer substrate 10a, that is, the Ni layer 34b and Cu layer 34c of the laminated foil 34, are removed by, for example, wet etching to expose the rear surface of the first insulating layer 11 and the rear surface of the first electrode pad 18, that is, the second end surface 18b, as illustrated in FIG. 25. The first mounting surface P1, on which to mount the electronic part 50 such as, for example, a semiconductor device, is formed, completing the processes of manufacturing the circuit substrate 10 according to this embodiment. The first mounting surface P1 of the circuit substrate 10 is kept in tight contact with the support substrate 30 during the manufacturing processes, so the surface roughness of the first mounting surface P1 follows the surface roughness of the support substrate 30, that is, the surface roughness of the Ni layer 34b of the laminated foil 34. Accordingly, the surface roughness of the first mounting surface P1, that is, the surface roughness of the rear surface of the first insulating layer 11 is smaller than the surface roughness of the first insulating layer 11 formed by polishing. As the etchant of the Ni layer 34b, a mixed solution of sulfuric acid and hydrogen peroxide may be used, for example. As the etchant of the Cu layer 34c, a strongly alkaline solution may be used. Although FIG. 25 illustrates only the circuit substrate 10 manufactured on the upper side of the support substrate 30 in FIG. 24, another circuit substrate 10, equivalent to this circuit substrate 10, is manufactured on the lower side.

Figure 26:
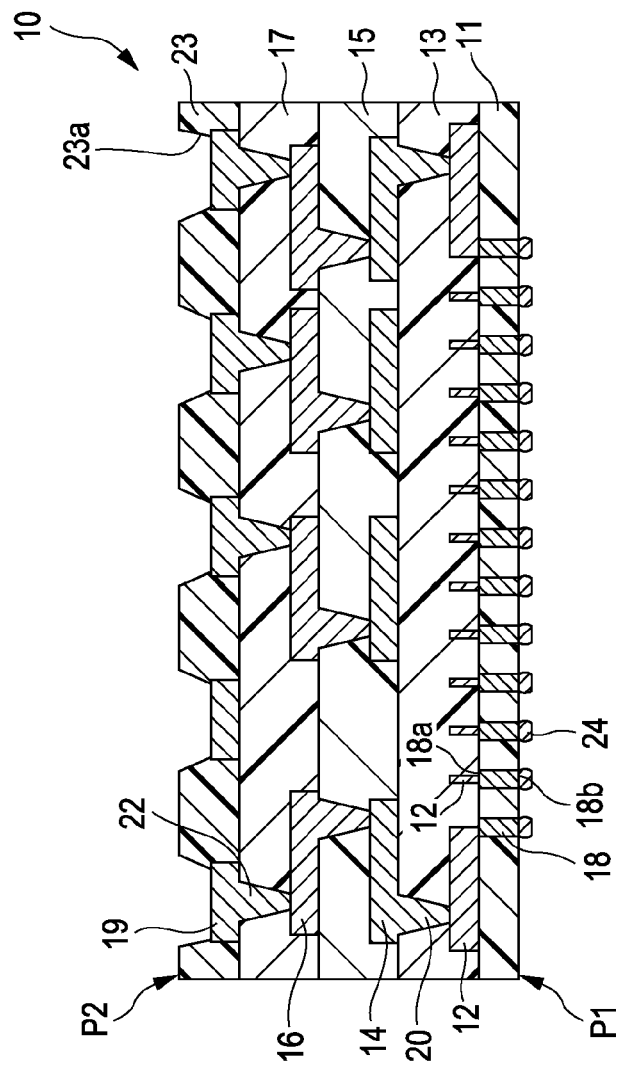
FIG. 26 illustrates a process of manufacturing the circuit substrate according to the first embodiment.

Next, as illustrated in FIG. 26, the second end surface 18b of each first electrode pad 18 on the circuit substrate 10 may be covered with, for example, the preliminary solder 24, as appropriate. The preliminary solder 24 may be formed by, for example, non-electrolytic plating.

As described above, with the circuit substrate 10 according to this embodiment, the first electrode pad 18 connected to one terminal 52 of the electronic part 50 such as, for example, a semiconductor device, is connected directly to the relevant first wiring pattern 12. That is, the circuit substrate 10 according to this embodiment does not have a via used to interconnect the first electrode pad 18 and first wiring pattern 12. This solves the problem of the large electrode pad size due to the manufacturing of a via. Accordingly, the first electrode pad 18 can be made compact and the pitch between first electrode pads 18 can be reduced to match the compact size of the terminal 52 of the electronic part 50 such as, for example, a semiconductor device and the small pitch between terminals 52.

Since the circuit substrate 10 according to this embodiment has no via that interconnects one first electrode pad 18 and the relevant first wiring pattern 12, a desmear process carried out in the via manufacturing process can be excluded. Accordingly, a time taken to manufacture the circuit substrate 10 can be shortened by a time that would otherwise be taken to carry out the desmear process.

Furthermore, with the circuit substrate 10 according to this embodiment, only the first end surface 18b of the first electrode pad 18 is exposed on the first mounting surface P1 on which to mount the electronic part 50 such as, for example, a semiconductor device. Accordingly, when, for example, the preliminary solder 24 is reflowed, the preliminary solder 24 does not spread from the second end surface 18b of the first electrode pad 18, enabling the amount of preliminary solder 24 to be reduced.

Second Embodiment

Next, a second embodiment will be described with reference to FIG. 27.

Structure of an Electric Device 100

Figure 27:
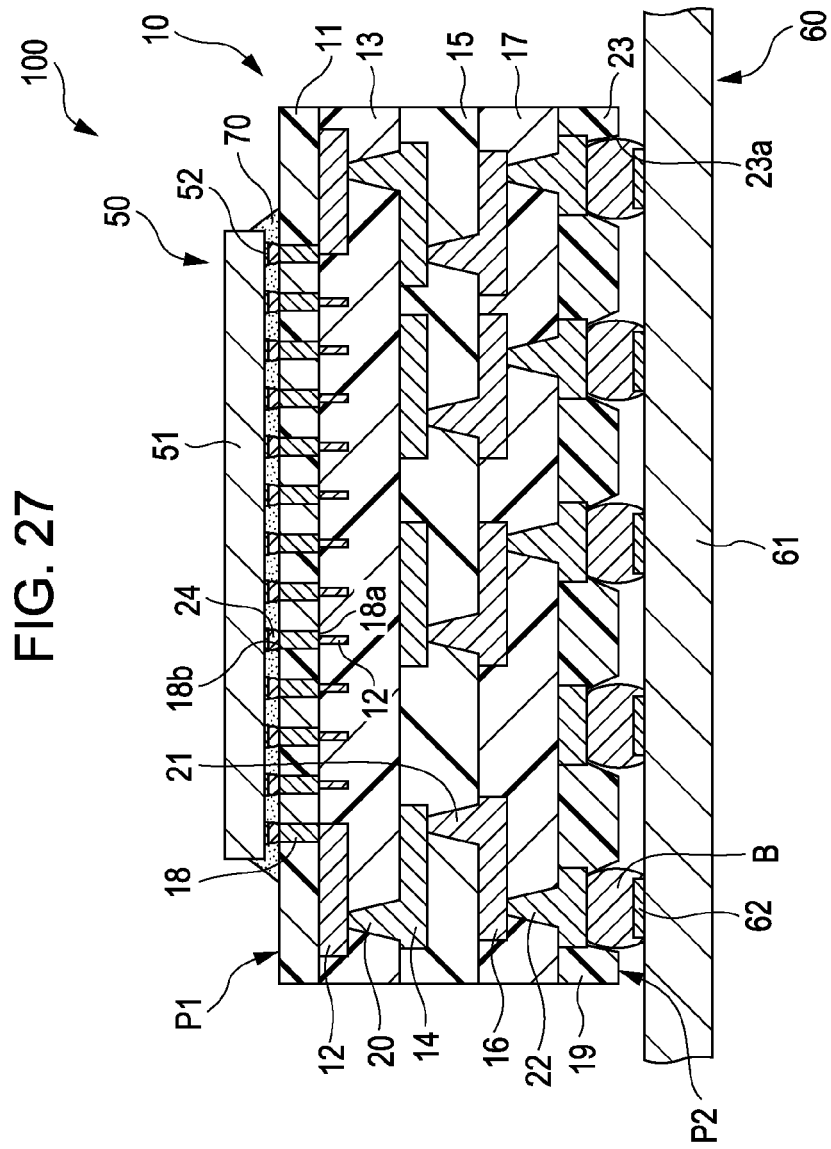
FIG. 27 is a cross sectional view of an electronic device according to a second embodiment.

FIG. 27 is a cross sectional view of the electronic device 100 according to a second embodiment.

As illustrated in FIG. 27, the electric device 100 according to the second embodiment includes the circuit substrate 10 according to the first embodiment, the electronic part 50 such as, for example, a semiconductor the device, the external circuit substrate 60 such as, for example, a motherboard, and an underfill resin 70 placed in a spacing between the circuit substrate 10 and the electronic part 50, the underfill resin 70 being used as appropriate. The circuit substrate 10 is placed so that the first mounting surface P1 faces upward and the second mounting surface P2 faces downward, as illustrated in FIG. 27.

The electronic part 50 includes the main body 51 and a plurality of terminals 52 formed on the main body 51. Each terminal 52 is connected to the relevant first electrode pad 18 on the circuit substrate 10 through the relevant preliminary solder 24. The size and place of the terminal 52 and the number of terminals 52 may conform to the size and place of the first electrode pad 18 on the circuit substrate 10 and the number of first electrode pads 18.

The external circuit substrate 60 includes the main body 61 and a plurality of electrode pads 62 formed on the main body 61. Each electrode pad 62 is connected to the relevant first electrode pad 18 on the circuit substrate 10 through the relevant solder ball B. The size and place of the electrode pad 62 and the number of electrode pads 62 may conform to the size and place of the first electrode pad 18 on the circuit substrate 10 and the number of first electrode pads 18.

The underfill resin 70 is placed to increase the connection strength of the circuit substrate 10 and electronic part 50. The underfill resin 70 may be formed of, for example, an epoxy resin.

Processes of Manufacturing the Electric Device 100

Next, the processes of manufacturing the electric device 100 will be described.

In the manufacturing of the electric device 100, the electronic part 50 such as a semiconductor device is first placed on the first mounting surface P1 of the circuit substrate 10 according to the first embodiment. For example, the electronic part 50 is held by a bonding head (not illustrated), and each terminal 52 of the electronic part 50 is press-fitted to the relevant preliminary solder 24 applied to the relevant second end surface 18b of the first electrode pad 18 on the circuit substrate 10. The preliminary solder 24 is then melted by the heater of the bonding head to connect the terminal 52 of the electronic part 50 to the first electrode pad 18 on the circuit substrate 10.

Next, a liquid resin is poured into the spacing between the circuit substrate 10 and the electronic part 50. The resin may be an epoxy resin, for example. After the spacing between the circuit substrate 10 and the electronic part 50 has been filled with the resin, the resin is heated in, for example, an oven to cure the resin, forming the underfill resin 70. The electric device 100 is completed through these processes.

The circuit substrate 10 on which the electronic part 50 is mounted may be mounted on the external circuit substrate 60. Since the circuit substrate 10 has the second electrode pads 19 as externally connected terminals on the second mounting surface P2, each second electrode pad 19 can be connected to the relevant electrode pad 62 of the external circuit substrate 60 through the relevant solder ball B. For example, it suffices to mount the solder balls B, which are attached to the second electrode pads 19 on the circuit substrate 10, on the electrode pads 62 on the external circuit substrate 60 and pass the solder balls B through a reflow oven.

As described above, with the circuit substrate 10 according to this embodiment, the first mounting surface P1 on which to mount the electronic part 50 such as, for example, a semiconductor device is flattened by positioning the rear surface of the first insulating layer 11 and the second end surface 18b of each first electrode pad 18 at the same height. When a liquid resin is poured into the spacing between the circuit substrate 10 and the electronic part 50, therefore, it is hard for air to enter the resin, suppressing voids generated in the underfill resin 70. This thereby suppresses a reduction in bonding strength between the circuit substrate 10 and the electronic part 50, which would otherwise be caused by the voids generated in the underfill resin 70.

Furthermore, with the circuit substrate 10 according to this embodiment, since the first mounting surface P1 of the circuit substrate 10 is flattened, the use of a solder resist is suppressed. This enables a large spacing to be secured between the circuit substrate 10 and the electronic part 50, making it easy to pour a resin into the spacing between the circuit substrate 10 and the electronic part 50. Accordingly, failures in connection between the first electrode pads 18 on the circuit substrate 10 and the terminals 52 of the electronic part 50 can be suppressed, which would otherwise be caused when the resin is poured into the spacing between the circuit substrate 10 and the electronic part 50.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a circuit board, the method comprising
    forming a first electrode on a support substrate;
    covering the support substrate and the first electrode with a first insulating layer;
    polishing the first insulating layer to expose a first surface of the first electrode;
    forming a first wiring on the first insulating layer after exposing the first surface of the first electrode, the first wiring being connected to the first electrode; and
    removing the support substrate to expose a second surface of the first electrode after forming the first wiring.

2. The method according to claim 1, wherein
    the polishing the first insulating layer is carried out until the first insulating layer becomes thinner than the first electrode.

3. The method according to claim 1, wherein
    the forming the first electrode includes:
    forming a first resist film on the support substrate, the first resist film having a first opening through which the support substrate is partially exposed, and
    depositing a metal film on the support substrate which is exposed in the first opening.

4. The method according to claim 1, wherein
    the forming the first wiring includes:
    forming a second resist film on the first insulating layer, the second resist film having a second opening through which the first insulating layer and the first surface of the first electrode are partially exposed, and
    depositing a metal film on the first insulating layer and the first surface of the first electrode which are exposed in the second opening.

5. The method according to claim 1, further comprising:
    covering the first insulating layer and the first wiring with a second insulating layer before removing the support substrate; and
    forming a second electrode electrically connected to the first wiring after covering the first insulating layer and the first wiring.

6. The method according to claim 1, further comprising:
    covering the first insulating layer and the first wiring with a second insulating layer before removing the support substrate;
    forming a second wiring on the second insulating layer, the second wiring being electrically connected to the first wiring through a via formed in the second insulating layer;
    covering the second insulating layer and the second wiring with a third insulating layer; and
    forming a second electrode electrically connected to the second wiring after covering the second insulating layer and the second wiring.

7. The method according to claim 6, wherein
    the forming the second wiring include:
    forming a via hole reaching the first wiring in the second insulating layer,
    forming a third resist film on the second insulating layer, the third resist film having a third opening through which the second insulating layer and the via hole are partially exposed, and
    depositing a metal film on the second insulating layer and the via hole which are exposed in the third opening.

8. A method of manufacturing an electronic device, the method comprising:
    forming a first electrode on a support substrate;
    covering the support substrate and the first electrode with a first insulating layer;
    polishing the first insulating layer to expose a first surface of the first electrode;
    forming a first wiring on the first insulating layer after exposing the first surface of the first electrode, the first wiring being connected to the first electrode;
    removing the support substrate to expose a second surface of the first electrode after forming the first wiring;
    covering the second surface of the first electrode with a solder; and
    coupling a terminal of an electronic device to the second surface of the first electrode with the solder.

9. The method according to claim 8, further comprising:
    filling a spacing between the first insulating layer and the electronic device with a resin after coupling the terminal of the electronic device to the second surface of the first electrode.

* * * * *